United States Patent
Izumi et al.

(10) Patent No.: US 7,795,048 B2
(45) Date of Patent: Sep. 14, 2010

(54) METHOD OF MEASURING FILM THICKNESS AND METHOD OF MANUFACTURING SEMICONDUCTOR DEVICE

(75) Inventors: Kazutoshi Izumi, Kawasaki (JP); Tetsuya Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 497 days.

(21) Appl. No.: 11/409,269

(22) Filed: Apr. 24, 2006

(65) Prior Publication Data

US 2007/0148791 A1 Jun. 28, 2007

(30) Foreign Application Priority Data

Dec. 27, 2005 (JP) ............................. 2005-375678

(51) Int. Cl.
H01L 21/66 (2006.01)
(52) U.S. Cl. ............. 438/14; 257/E21.53; 257/E21.011
(58) Field of Classification Search ................... 438/14, 438/16, 393, 396; 257/E21.521, E21.53, 257/E21.528, E21.009, E21.011
See application file for complete search history.

(56) References Cited

U.S. PATENT DOCUMENTS

| | | | | |
|---|---|---|---|---|
| 6,919,593 B2 * | 7/2005 | Ishihara | ...................... | 257/295 |
| 2003/0218202 A1 * | 11/2003 | Sato | ........................... | 257/306 |
| 2004/0235392 A1 * | 11/2004 | Ohta | ............................ | 451/6 |
| 2005/0161716 A1 | 7/2005 | Matsuura et al. | | |
| 2006/0157762 A1 * | 7/2006 | Hikosaka et al. | ............ | 257/295 |

FOREIGN PATENT DOCUMENTS

JP 2003-347512 12/2003
JP 2005-217044 8/2005

* cited by examiner

Primary Examiner—Victor A Mandala
Assistant Examiner—Scott Stowe
(74) Attorney, Agent, or Firm—Fujitsu Patent Center

(57) ABSTRACT

A method of measuring a film thickness is disclosed. The method includes a step of forming a ferroelectric capacitor on a substrate, a step of forming an insulating film to cover the ferroelectric capacitor, and a step of optically measuring the thickness of the insulating film on an electrode of the ferroelectric capacitor.

7 Claims, 8 Drawing Sheets

33 CMOS Tr

33 CMOS Tr

33 CMOS Tr

FIG.7

| Wafer | | INITIAL | | | | AFTER POLISH | | | |
|---|---|---|---|---|---|---|---|---|---|
| | BASE | Target | Ave. | Max-Min | GOF | Target | Ave. | Max-Min | GOF |
| TEST PIECE | Pt/AlO | 1420 | 1486.3 | 105.3 | 0.896 | 770 | 800.3 | 146.2 | 0.96 |
| | Si | 1420+α* | 1489.1 | 133.1 | — | 1040+α* | 1036.9 | 140.4 | 0.907 |
| PRODUCT 1 | Pt/AlO | 1420 | 1506.8 | 105.8 | 0.837 | 770 | 835.7 | 159.4 | 0.844 |
| PRODUCT 2 | Pt/AlO | 1420 | 1494.7 | 103.8 | 0.864 | 770 | 809.0 | 156.7 | 0.878 |

*α≒0

METHOD OF MEASURING FILM THICKNESS AND METHOD OF MANUFACTURING SEMICONDUCTOR DEVICE

CROSS-REFERENCE TO RELATED APPLICATIONS

This application is based upon and claims priority of Japanese Patent Application No. 2005-375678, filed on Dec. 27, 2005, the contents being incorporated herein by reference.

BACKGROUND OF THE INVENTION

1. Field of the Invention

The present invention generally relates to a method of measuring film thickness of a semiconductor device, and particularly relates to a film thickness measuring method for use in a process of forming an insulating film after a process of forming a ferroelectric capacitor, and a semiconductor device manufacturing method using the same.

2. Description of the Related Art

In film forming/polishing processes of semiconductor devices, process management and control based on real time measurement of film thickness is required in order to improve yield and ensure device reliability. Especially, controlling the thickness of films formed on elements by sputtering is important because the film thickness affects the properties of the elements.

However, there has been no appropriate method for controlling the thickness of insulating films that are formed after ferroelectric memories (FeRAMs) production processes. Some of the reasons are: that the accuracy of optical film thickness measurements is low due to the complicated structure of films formed on silicon substrates; and that measurements utilizing reflection from metal surfaces are not applicable to materials having low reflectance. Therefore, no guarantee based on standards has been provided.

FIGS. 1 and 2 are cross-sectional views showing an example of a semiconductor device for illustrating problems with a related art film thickness measuring method in a FeRAM production process. Referring to FIG. 1, a first interlayer insulating film 110 is formed on a transistor (not shown) on a silicon substrate. A ferroelectric capacitor 125 is formed on the first interlayer insulating film 110, with a SiON cap film 111, a TEOS cap film 112, and an $Al_2O_3$ cap film 113 interposed therebetween. The ferroelectric capacitor 125 includes a lower electrode 121, a ferroelectric film 122, and an upper electrode 123. The lower electrode 121 is an extraction electrode extending horizontally to be connected to an upper interconnect (see, for example, Patent Document 1). The ferroelectric capacitor 125 is entirely covered with an $Al_2O_3$ capacitor protecting film (hydrogen diffusion preventing film) 126. It is to be noted that the $Al_2O_3$ capacitor protecting film 126 on the upper electrode 123 is denoted by the reference number 126a and the rest of the part of the $Al_2O_3$ capacitor protecting film 126 is denoted by the reference number 126b.

In the example shown in FIG. 1, the ferroelectric film 122 is made of PZT, and the lower electrode 121 is made of platinum (Pt). The upper electrode 123 is made of iridium oxide ($IrO_2$). The reason why the upper electrode 123 made of iridium oxide ($IrO_2$) is used herein is to prevent hydrogen-induced degradation of the ferroelectric (PLZT) film 122 (see, for example, Patent Documents 1 and 2).

A second interlayer insulating film 128 is formed to cover the ferroelectric capacitor 125. The second interlayer insulating film 128 needs to be polished to a dashed line shown in FIG. 1 to have a predetermined design thickness so as to be flattened as shown in FIG. 2. In the example shown in FIGS. 1 and 2, the design thickness of the second interlayer insulating film 128 is 300 nm from the surface of the $Al_2O_3$ capacitor protecting film 126a on the upper electrode 123. That is, a polishing process such as CMP needs to be controlled to make the second interlayer insulating film 128 eventually have this design thickness.

For obtaining the second interlayer insulating film 128 having the design thickness after polishing, the thickness of the second interlayer insulating film 128 before polishing needs to be accurately measured so as to determine the polishing amount. In this example, although the design initial thickness (i.e. design thickness before polishing) of the second interlayer insulating film 128 from the $Al_2O_3$ capacitor protecting film 126 is 1400 nm, the actual initial thickness of the second interlayer insulating film 128 does not always agree with the design initial thickness due to variation of film forming conditions. Therefore, the actual thickness of the second interlayer insulating film 128 needs to be measured so as to determine the polishing amount. However, the thickness of the second interlayer insulating film 128 cannot be optically measured directly on the upper electrode 123 because iridium oxide ($IrO_2$) used as the material of the upper electrode 123 has low reflectance.

One solution for this problem would be to measure the total thickness at a part where the ferroelectric capacitor 125 is not located and calculate the thickness of the second interlayer insulating film 128 based on the thickness from the silicon substrate. However, if the total thickness is measured at a part where the ferroelectric capacitor 125 is not located, since the first interlayer insulating film 110, the SiON cap film 111, the TEOS cap film 112, etc., are stacked on the silicon substrate (not shown), information from the reflection light is complicated. Therefore, the thickness from the substrate surface (indicated by the arrows with x mark of FIG. 1) cannot be accurately calculated.

That is, it is impossible to control the final thickness (i.e. thickness after polishing) of the second interlayer insulating film 128 to match the design thickness of 300 nm from the $Al_2O_3$ capacitor protecting film 126a on the upper electrode 123. This might cause a problem of overetching into the $Al_2O_3$ capacitor protecting film 126a and the upper electrode 123.

In the actual process, a pilot wafer is vertically cut so as to measure the thickness of the second interlayer insulating film 128 on the ferroelectric capacitor 125 real time by cross-sectional SEM observation. This method not only wastes the wafer but also makes the manufacturing process complicated because additional processes such as a cutting process are required for film thickness observation.

<Patent Document 1> Japanese Patent Laid-Open Publication No. 2005-217044
<Patent Document 2> Japanese Patent Laid-Open Publication No. 2003-347512

SUMMARY OF THE INVENTION

The present invention may solve at least one problem described above.

The present invention is directed to a film thickness measuring method capable of efficiently and non-destructively measuring the thickness of an insulating film on a ferroelectric capacitor inline, and a semiconductor device manufacturing method including such a film thickness measuring method.

The above described problems may be solved by optically measuring the thickness of the insulating film directly on an electrode of the ferroelectric capacitor. The concrete solutions would be to:

(1) measure the thickness of the insulating film on a lower electrode of the ferroelectric capacitor, utilizing the shape of an extended portion of the lower electrode of the ferroelectric capacitor; and (2) form an upper electrode of the ferroelectric capacitor with a material having high reflectance.

According to the solution (1), the film thickness is non-destructively measured based on reflection from the lower electrode, utilizing the shape of the existing ferroelectric capacitor.

According to the solution (2), regardless of the shape of the ferroelectric capacitor, the film thickness is measured on the upper electrode of the ferroelectric capacitor.

Based on such idea, according to an aspect of the present invention, there is provided a method of measuring a film thickness that comprises the steps of (a) forming a ferroelectric capacitor on a substrate, (b) forming an insulating film to cover the ferroelectric capacitor, and (c) optically measuring a thickness of the insulating film on an electrode of the ferroelectric capacitor.

Preferably, the ferroelectric capacitor is formed in a shape such that a lower electrode of the electrodes includes an extended portion, and the film thickness of the insulating film on the extended portion of the lower electrode is optically measured.

According to another aspect of the present invention, there is provided a method of manufacturing a semiconductor device that utilizes the above-described method of measuring a film thickness. The method of manufacturing a semiconductor device comprises the steps of (a) forming a ferroelectric capacitor on a semiconductor substrate, (b) forming an insulating film to cover the ferroelectric capacitor, (c) optically measuring a thickness of the insulating film on an electrode of the ferroelectric capacitor, (d) determining a polishing amount based on the measured film thickness, and (e) polishing the insulating layer based on the polishing amount to flatten the insulating layer.

Preferably, the above-described method of manufacturing a semiconductor device further comprises the steps of (f) optically measuring a thickness of the polished insulating film on the electrode of the ferroelectric capacitor, and (g) further polishing the insulating film if the measured thickness of the polished insulating film has not reached a predetermined thickness.

With the above-described methods, the thickness of insulating film on the ferroelectric capacitor can be non-destructively measured in the actual process of manufacturing semiconductor wafers.

Accordingly, yield and productivity in manufacturing semiconductor devices are increased.

BRIEF DESCRIPTION OF THE DRAWINGS

FIG. 7 is a table that shows results of a film thickness measurement according to an embodiment of the present invention.

DETAILED DESCRIPTION OF THE PREFERRED EMBODIMENT

Figure 1:
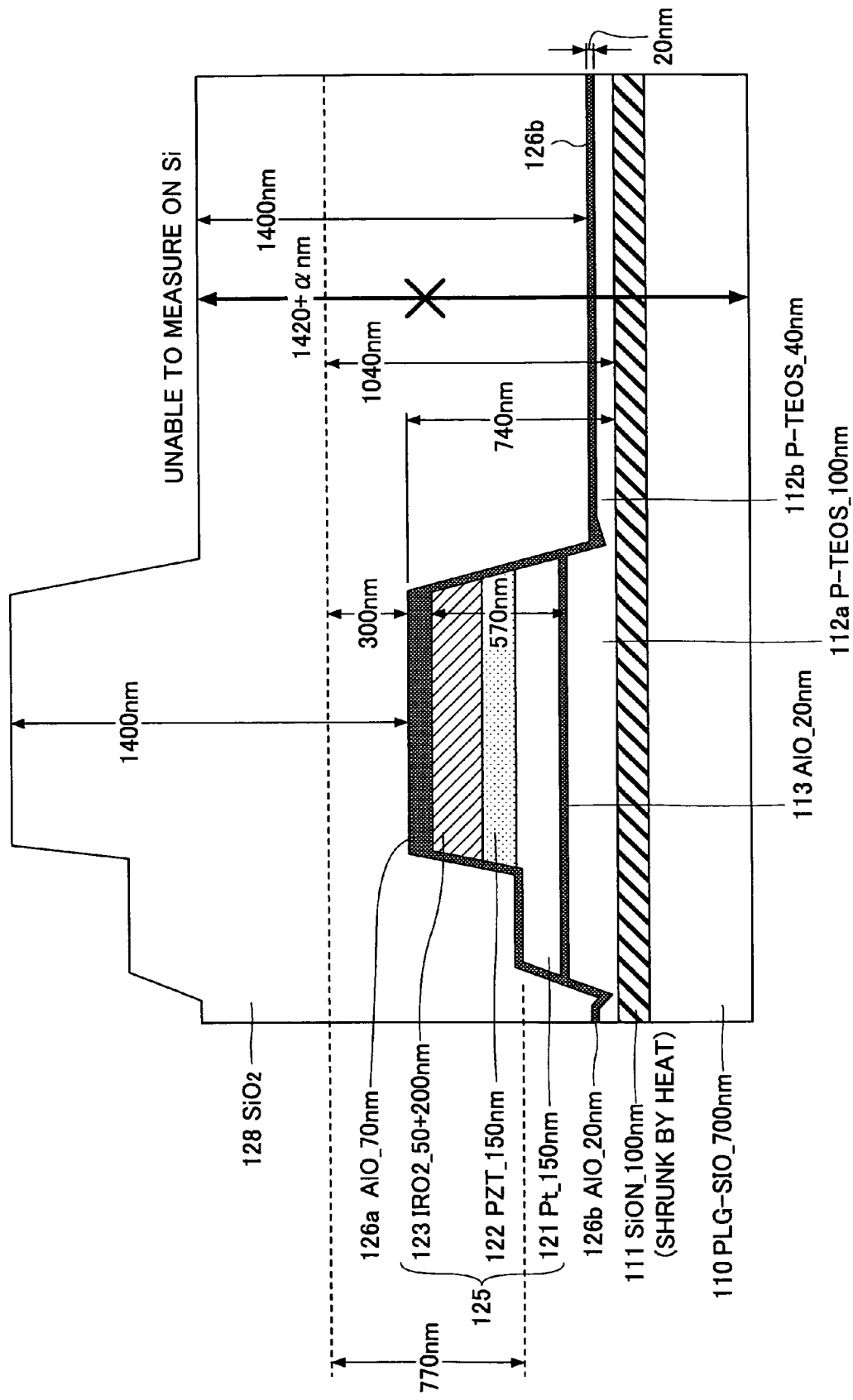
FIG. 1 is a cross-sectional view showing a semiconductor device for illustrating problems with a related art method of measuring the thickness of an insulating film on a ferroelectric capacitor.
Figure 2:
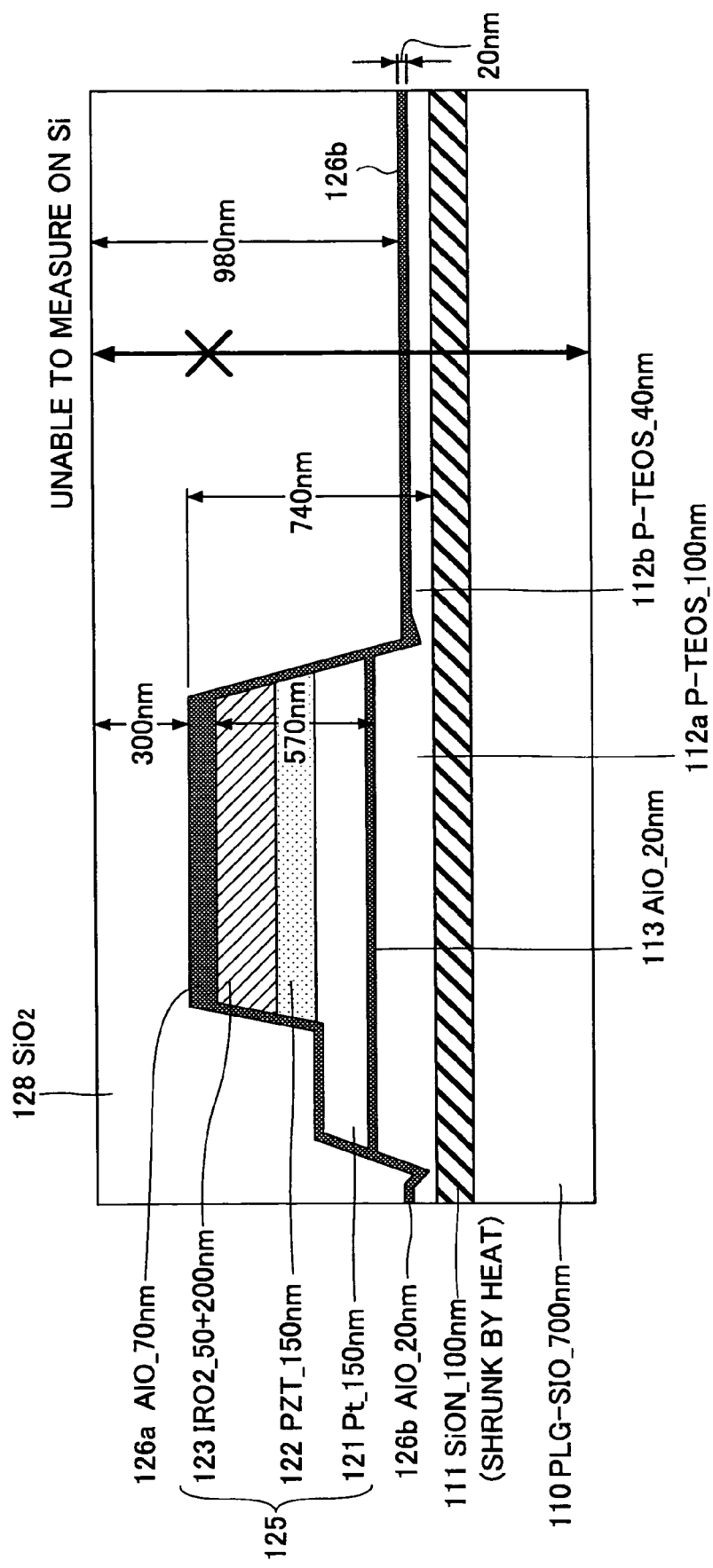
FIG. 2 is a cross-sectional view showing a semiconductor device for illustrating problems with a related art method of measuring the thickness of an insulating film on a ferroelectric capacitor.
Figure 3:
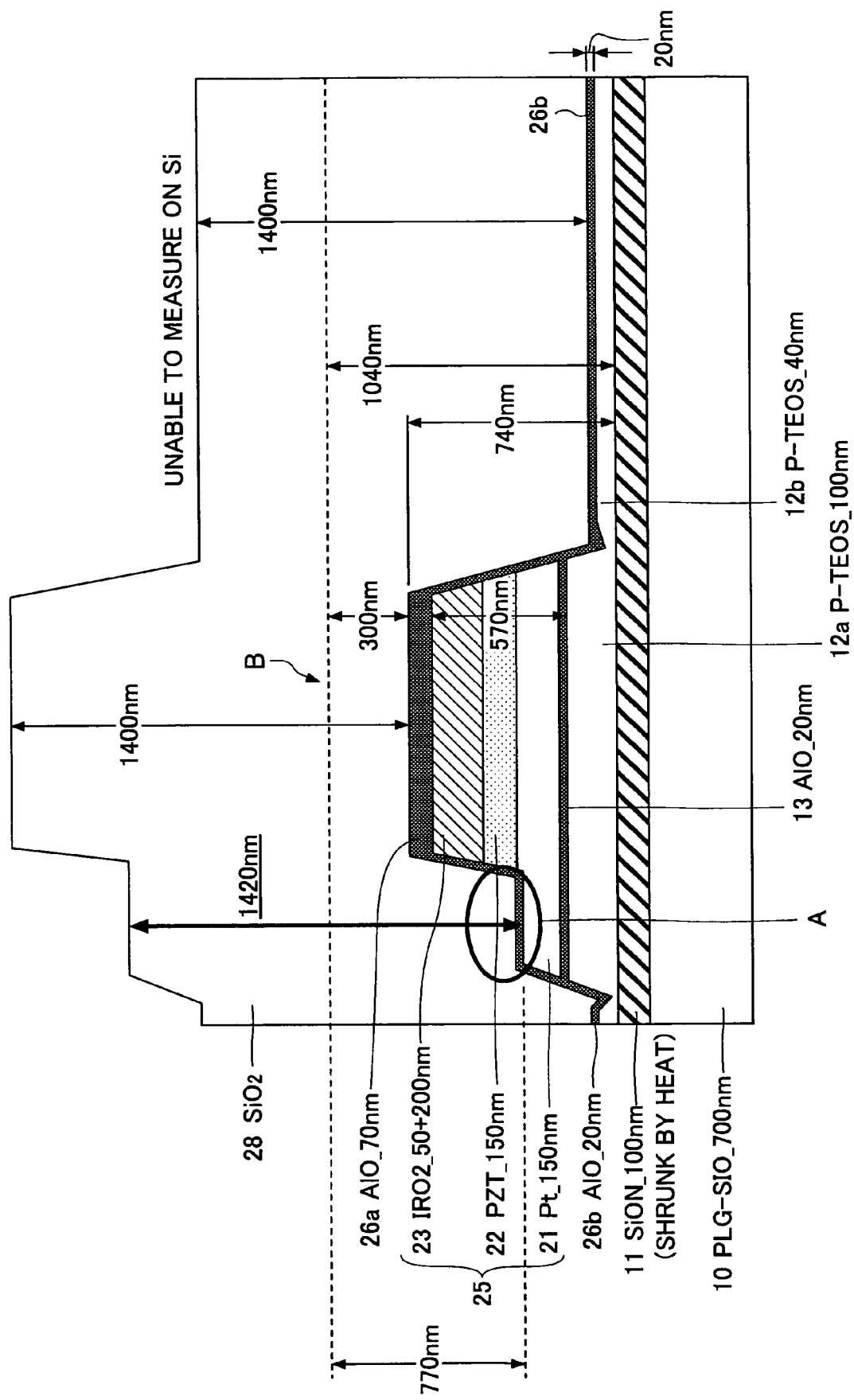
FIG. 3 is a cross-sectional view showing a semiconductor device for illustrating a method of measuring the thickness of an insulating film on a ferroelectric capacitor according to an embodiment of the present invention.
Figure 4:
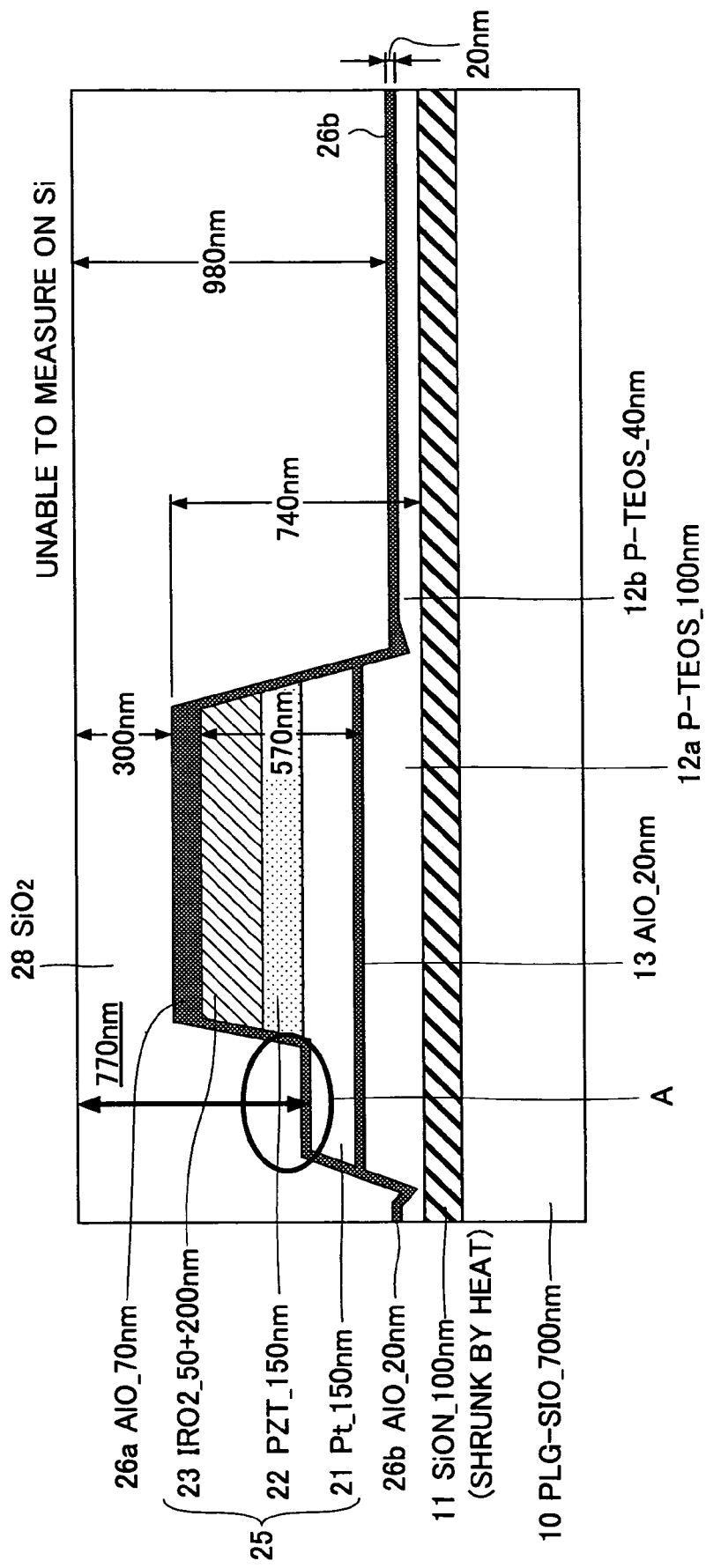
FIG. 4 is a cross-sectional view showing a semiconductor device for illustrating a method of measuring the thickness of an insulating film on a ferroelectric capacitor according to an embodiment of the present invention.

FIGS. 3 and 4 are cross-sectional views showing an example of a semiconductor device for illustrating a film thickness measuring method according to an embodiment of the present invention.

Referring to FIG. 3, a first interlayer insulating film 10 of 700 nm thickness is formed to cover a transistor (not shown) on a silicon substrate. A ferroelectric capacitor 25 is formed on the first interlayer insulating film 10, with a SiON cap film 11, a TEOS cap film 12, and an $Al_2O_3$ cap film 13 interposed therebetween.

The ferroelectric capacitor 25 includes a lower electrode 21, a ferroelectric film 22, and an upper electrode 23. The lower electrode 21 is an extraction electrode extending horizontally to be connected to an upper interconnect. The ferroelectric capacitor 25 is entirely covered with an $Al_2O_3$ capacitor protecting film (hydrogen diffusion preventing film) 26. It is to be noted that the $Al_2O_3$ capacitor protecting film 26 on the upper electrode 23 is denoted by the reference number 26a and the rest of the part of the $Al_2O_3$ capacitor protecting film 26 is denoted by the reference number 26b.

The ferroelectric film 122 is made of PZT, and the lower electrode 21 is made of platinum (Pt). The upper electrode 23 is made of iridium oxide ($IrO_2$). The reason why the upper electrode 23 made of iridium oxide ($IrO_2$) is used herein is to prevent hydrogen-induced degradation of the ferroelectric (PLZT) film 22.

A second interlayer insulating film 28 is formed on the $Al_2O_3$ capacitor protecting film 26. The initial film thickness of the second interlayer insulating film 28 needs to be measured to determine whether the initial thickness matches the design thickness. In the example shown in FIG. 3, the design thickness of the second interlayer insulating film 28 is 1400 nm.

The thickness of the second interlayer insulating film 28 on an extended portion (indicated by a circle A) of the lower electrode 21 is optically measured. The method of the optical film thickness measurement may be spectroscopic ellipsometry that irradiates polarized light and measures changes in polarization state of reflected polarized light, or may be an X-ray reflectivity (XRR) method that irradiates X-rays and calculates the film thickness based on the interference waveform of the reflected X-rays.

As the $Al_2O_3$ capacitor protecting film 26b on the lower electrode 21 does not reflect the irradiated light, the irradiated light is reflected by the surface of the lower electrode 21 made of platinum (Pt). The thickness of the $Al_2O_3$ capacitor protecting film 26b on the lower electrode 21 is 20 nm, which is known in advance.

Accordingly, if the thickness calculated based on the reflection light is 1420 nm, the second interlayer insulating film 28 has the thickness as designed. In some cases, the thickness may be greater than or less than 1420 nm depending on film forming conditions. In any event, the polishing amount is determined based on the optically measured film thickness such that the second interlayer insulating film 28 has the final thickness corresponding to a horizontal dashed line B of FIG. 3. For example, if the measured film thickness is 1420 nm, the second interlayer insulating film 28 is polished by 1100 nm above the upper electrode 23.

When the second interlayer insulating film 28 is polished by a CMP process by the calculated polishing amount, the surface of the second interlayer insulating film 28 is flattened as shown in FIG. 4. The thickness of the polished second interlayer insulating film 28 is optically measured to determine whether the CMP process is accurately performed. More specifically, a measuring light is irradiated onto the extended portion (indicated by a circle A of FIG. 4) of the lower electrode 21 made of platinum, and the thickness of the polished second interlayer insulating film 28 from the surface of the lower electrode 21 is calculated based on information from the reflected light.

With reference to FIG. 4, the thicknesses of the upper electrode 23 and the ferroelectric film 22 of the ferroelectric capacitor 25, and the thickness of the $Al_2O_3$ capacitor protecting film 26a on the upper electrode 23 are known. In the example shown in FIG. 4, the thicknesses of the upper electrode 23 made of $IrO_2$, the ferroelectric film 22, and the $Al_2O_3$ capacitor protecting film 26a on the upper electrode 23 are 250 nm, 150 nm, and 70 nm, respectively.

That is, the target for the measured thickness of the second interlayer insulating film 28 is 770 nm from the surface of the lower electrode 21. This thickness corresponds to a design thickness, which is 300 nm, from the surface of the $Al_2O_3$ capacitor protecting film 26a on the upper electrode 23. Since non-destructive measurement utilizing light irradiation is used as described above, the thickness of the second interlayer insulating film 28 can be measured in real time during the CMP process. Thus, the second interlayer insulating film 28 can be accurately polished to have the target thickness.

In the example shown in FIGS. 3 and 4, iridium oxide ($IrO_2$) is used as the material of the upper electrode 23 of the ferroelectric capacitor 25 to prevent hydrogen-induced degradation. However, other materials having high reflectance, such as Ti, TiN, Al, Pt, and Ir, may alternatively be used such that the thickness of the second interlayer insulating film 28 can be measured on the upper electrode 23 by irradiating a measuring light directly onto the upper electrode 23. In that case, the target for the measured thickness of the second interlayer insulating film 28 is 370 nm from the upper electrode 23. This target thickness is the sum of the thickness (70 nm) of the $Al_2O_3$ capacitor protecting film 26a on the upper electrode 23 and the design thickness (300 nm) of the second interlayer insulating film 28 on the $Al_2O_3$ capacitor protecting film 26a.

Although platinum (Pt) is used as the material of the lower electrode 21 in the example shown in FIGS. 3 and 4, other materials having high reflectance, such as Ti, TiN, Al, and Ir, may alternatively be used.

Figure 5:
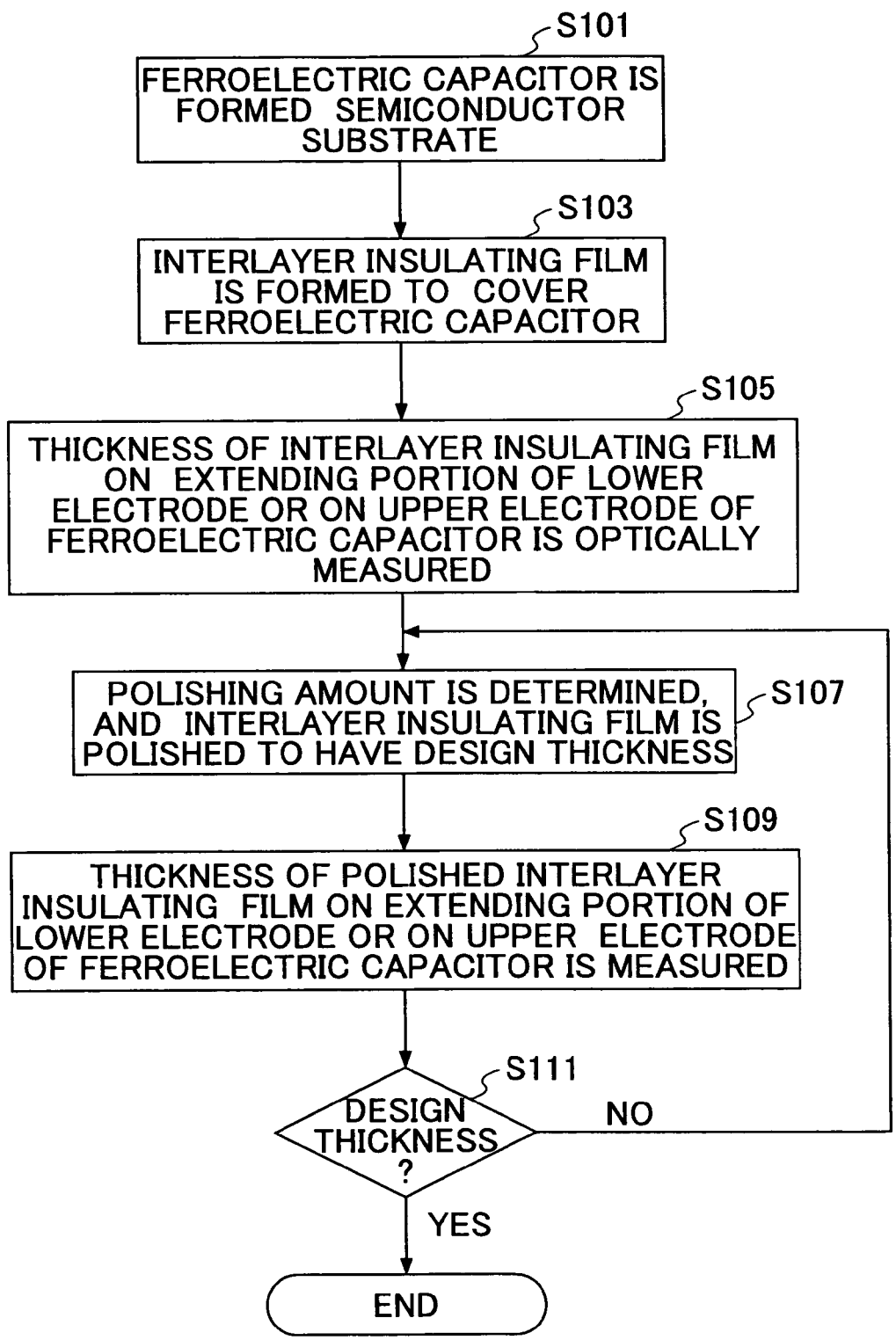
FIG. 5 is a flowchart illustrating a film thickness measuring method according to an embodiment of the present invention.

FIG. 5 is a flowchart illustrating the film thickness measuring method described with reference to FIGS. 3 and 4. The ferroelectric capacitor 25 is formed on the semiconductor substrate (S101), and the second interlayer insulating film 28 is formed to cover the ferroelectric capacitor 25 (S103). The thickness of the second interlayer insulating film 28 on the ferroelectric capacitor 25 on the extended portion of the lower electrode 21 of the ferroelectric capacitor 25 is optically measured. Alternatively, if the upper electrode 23 is made of a material having high reflectance, the thickness of the second interlayer insulating film 28 on the upper electrode 23 of the ferroelectric capacitor 25 may be optically measured (S105).

The polishing amount is determined based on the measured thickness of the second interlayer insulating film 28, and the second interlayer insulating film 28 is polished to have the design thickness (S107). The thickness of the polished second interlayer insulating film 28 on the extended portion of the lower electrode 21 of the ferroelectric capacitor 25 is optically measured. Alternatively, if the upper electrode 23 is made of a material having high reflectance, the thickness of the second interlayer insulating film 28 on the upper electrode 23 of the ferroelectric capacitor 25 may be optically measured (S109).

If the measured thickness has reached the design thickness (Yes in S111), polishing is finished. If the measured thickness has not reached the design thickness (No in S111), Steps S107 through S111 are repeated so as to achieve the design thickness.

With this measuring method, the thickness of the second interlayer insulating film 28 on the ferroelectric capacitor 25 can be accurately and non-destructively controlled inline.

Figure 6A:
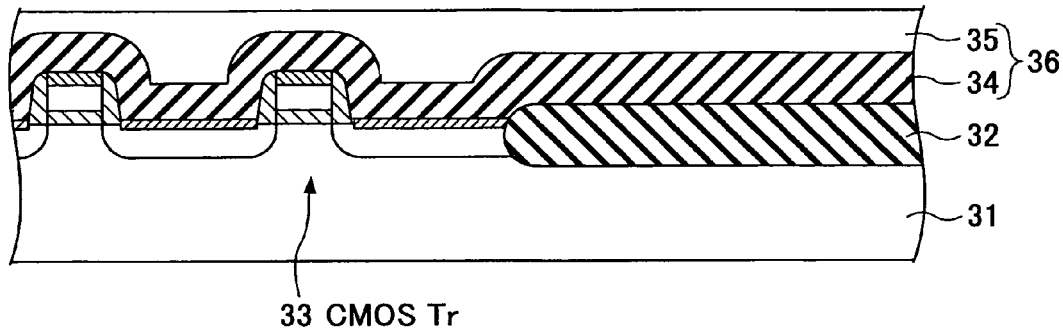
FIGS. 6A through 6F illustrate a semiconductor device manufacturing process according to an embodiment of the present invention.

FIGS. 6A through and 6F illustrate a semiconductor device manufacturing process according to an embodiment of the present invention. First, with reference to FIG. 6A, an element isolating film 32 is formed on the surface of a silicon substrate 31. Impurities are then selectively introduced into a predetermined transistor region so as to form wells (not shown). A CMOS transistor 33 with an LDD structure is formed in the transistor region. A SiON film 34 of, e.g., 100 nm thickness is formed as an oxidation preventing film. Further, a $SiO_2$ film 35 is formed thereon. The surface of the $SiO_2$ film 35 is flattened by polishing so as to have the thickness of 700 nm from the interface with the element isolating film 32. The SiON film 34 and the flattened $SiO_2$ film 35 form a first interlayer insulating film 36.

Figure 6B:
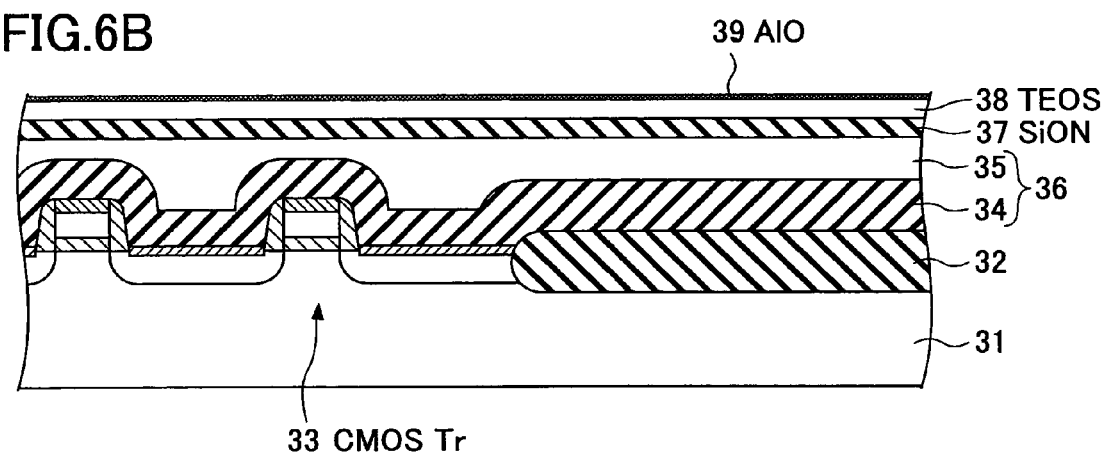

Then, as shown in FIG. 6B, a SiON cap film 37 of 100 nm thickness and a TEOS cap film 38 of 100 nm thickness are formed on the first interlayer insulating film 36. The TEOS cap film 38 is degassed (dehydrated) by annealing at 650° C. for 30 minutes in a nitrogen atmosphere. After that, an $Al_2O_3$ cap film 39 of 20 nm thickness is formed on the TEOS cap film 38 by high frequency sputtering.

Figure 6C:
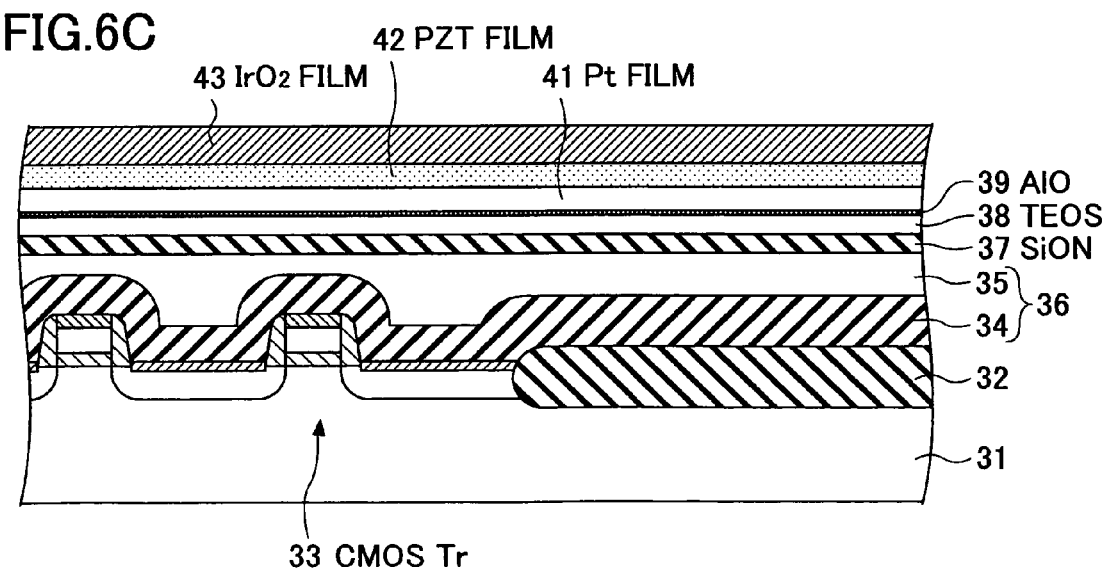

Then, as shown in FIG. 6C, a Pt film 41 as a lower electrode film, a PZT film 42 as a ferroelectric film, and an $IrO_2$ film 43 as an upper electrode film are sequentially formed on the $Al_2O_3$ cap film 39 by sputtering or other suitable methods. The thicknesses of the Pt film 41, the PZT film 42, and the $IrO_2$ film 43 are 150 nm, 150 nm, and 250 nm, respectively. Although iridium oxide ($IrO_2$), which is conductive oxide, is used as the material of the upper electrode film to prevent hydrogen-induced degradation, other materials having high reflectance such as Pt may alternatively be used as the material of the upper electrode film.

Figure 6D:
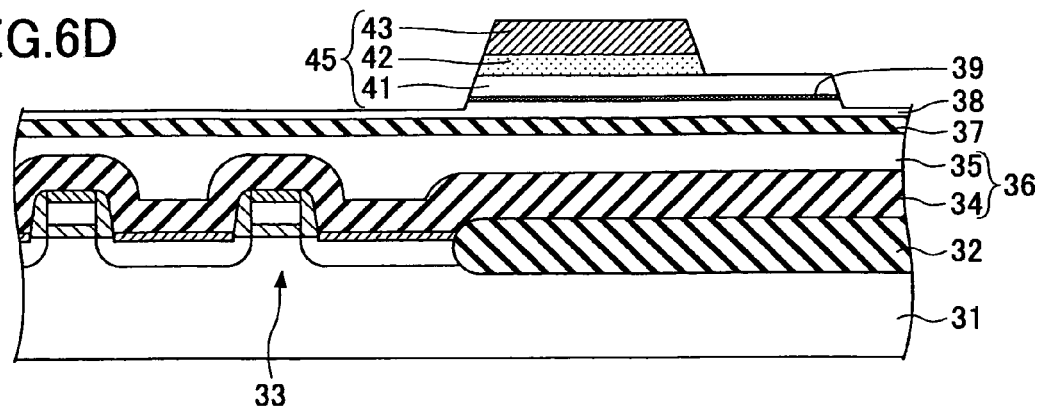

Then, with reference to FIG. 6D, the $IrO_2$ film 43, the PZT film 42, the Pt film 41, and the $Al_2O_3$ cap film 39 are sequentially etched so as to form a ferroelectric capacitor 45. More specifically, a first resist pattern (not shown) having a pattern of an upper electrode is formed on the $IrO_2$ film 43. The $IrO_2$ film 43 is etched by using the first resist pattern as a mask, so that the $IrO_2$ film 43 having a shape shown in FIG. 6D (hereinafter referred to as an upper electrode 43) is obtained. After the first resist pattern is removed, a second resist pattern (not shown) having a pattern of a capacity insulating film of the ferroelectric capacitor 45 is formed. The PZT film 42 is etched using the second resist pattern as a mask, so that the PZT film 42 having a shape shown in FIG. 6D (hereinafter referred to as a capacity insulating film 42) is obtained. After the second resist pattern is removed, a third resist pattern (not shown) having a pattern of a lower electrode including an extended portion is formed. The Pt film 41 and the $Al_2O_3$ cap film 39 are etched using the third resist pattern as a mask. The Pt film 41 having a shape shown in FIG. 6D is hereinafter referred to as a lower electrode 41. The TEOS cap film 38 is etched together in this step. Thus, the ferroelectric capacitor 45 that includes the lower electrode 41 including an extended portion is obtained.

Figure 6E:
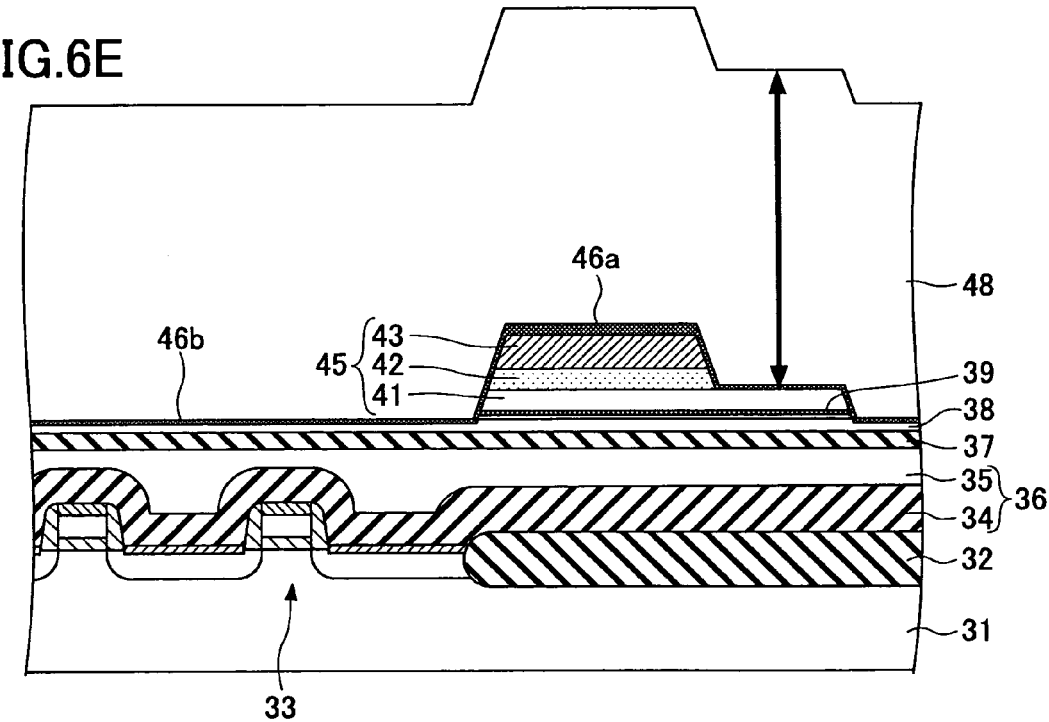

Referring to FIG. 6E, in order to protect the ferroelectric capacitor 45, an $Al_2O_3$ capacitor protecting film 46b of 20 nm thickness is formed. Then, $Al_2O_3$ is further sputtered only onto the upper electrode 43 to form an $Al_2O_3$ capacitor protecting film 46a of 70 nm thickness. After that, a second interlayer insulating film 48 of 1400 nm thickness is formed. The second interlayer insulating film 48 may be a silicon oxide film formed using, e.g., TEOS. In this stage, the thickness of the second interlayer insulating film 48 on the extended portion of the lower electrode 41 is optically measured.

Figure 6F:
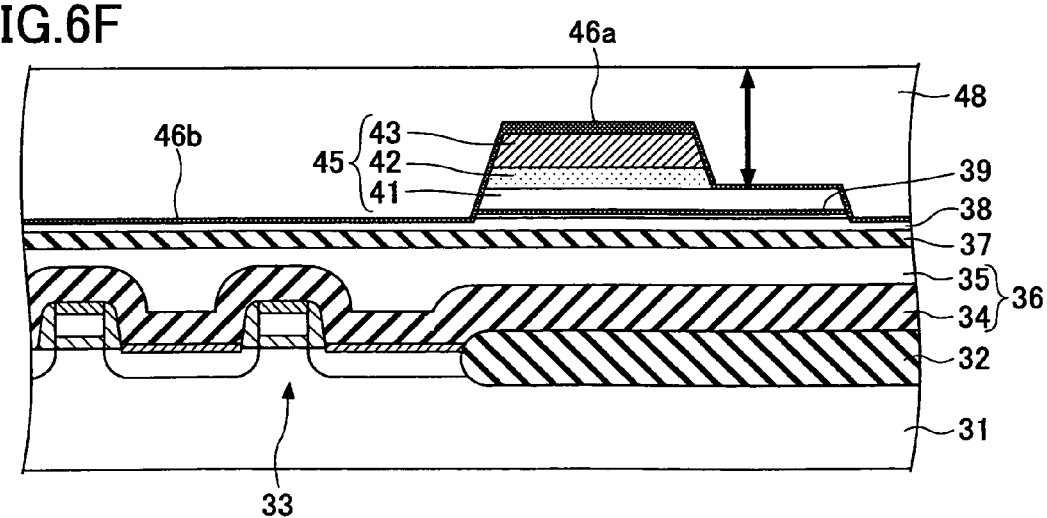

Then, as shown in FIG. 6F, the polishing amount is determined from the measured thickness, and the second interlayer insulating film 48 is polished to have a predetermined thickness based on the polishing amount. The thickness of the polished second interlayer insulating film 48 on the extended portion of the lower electrode 41 is measured to determine whether the measured thickness has reached the predetermined thickness. If the measured thickness has not reached the predetermined thickness, the second interlayer insulating film 48 is further polished so as to achieve the predetermine thickness.

Then, although not shown, tungsten (W) plugs are formed to reach source and drain diffusion layers of the CMOS transistor 33, respectively. Also, contact holes are formed to reach the upper electrode 43 and the lower electrode 41, respectively, of the ferroelectric capacitor 45. An Al interconnect having a predetermine shape is then formed on the second interlayer insulating film 48 and inside the contact holes. This Al interconnect includes interconnects for connecting the upper electrode 43 of the ferroelectric capacitor 45 to the source and drain diffusion layers of the CMOS transistors 33.

With the above described steps, the film thickness can be accurately and non-destructively measured inline during the manufacturing process of semiconductor devices. Accordingly, yield and productivity of semiconductor devices are increase.

FIG. 7 is a table that shows results of a film thickness measurement according to an embodiment of the present invention. A test piece, in which a ferroelectric capacitor was formed on a silicon substrate, and actual product wafers (#1 and #2) were prepared as samples for the film thickness measurement. The thickness of an interlayer insulating film on a Pt lower electrode was measured on each sample before and after polishing.

A target (design) thickness of the interlayer insulating film before polishing is 1420 nm from the Pt lower electrode. This thickness includes the thickness of an $Al_2O_3$ capacitor protecting film (20 nm). As the test piece does not have a complicated structure in lower layers thereof, the target thickness on the silicon substrate is 1420+α nm, wherein α is very small.

Spectroscopic Ellipsometry using polarized light irradiation was employed in this measurement. That is, changes in polarization state were measured to calculate a film thickness (d) as well as refractive index (n) and extinction coefficient (k) based on fitting analysis. GoF (Goodness-of-Fit) is a measure of how well the measured data coincide with the design data. The measured thicknesses are the averages of five-point measurement.

Generally, when GoF is about 0.9 (90%) or greater, the measured value of the film thickness is reliable. It was found from the measurement results that the measured thicknesses of the ferroelectric capacitor on the Pt lower electrode in the actual wafer products were very close to the target thickness compared to the film thickness of the test piece from the silicon substrate.

That is, unlike the related art method that requires cross-sectional SEM observation, wafers can be saved. Moreover, since the need for a cutting process in film thickness measurements is eliminated, manufacturing time can be reduced.

The present application is based on Japanese Priority Application No. 2005-375678 filed on Dec. 27, 2005, with the Japanese Patent Office, the entire contents of which are hereby incorporated by reference.

What is claimed is:

1. A method of measuring a film thickness, comprising the steps of:
    forming a ferroelectric capacitor on a substrate, the ferroelectric capacitor including an upper electrode and a lower electrode, the lower electrode including an extended portion;
    forming a capacitor protecting film having a known film thickness to cover the ferroelectric capacitor;
    forming an insulating film on the capacitor protecting film; and
    optically measuring a total film thickness of the insulating film and the capacitor protecting film on the extended portion of the lower electrode of the ferroelectric capacitor.

2. The method of measuring a film thickness as claimed in claim 1, wherein the lower electrode of the ferroelectric capacitor is made of any one of Ti, TiN, Al, Pt, and Ir.

3. A method of manufacturing a semiconductor device, comprising the steps of:
    forming a ferroelectric capacitor on a semiconductor substrate, the ferroelectric capacitor including an upper electrode and a lower electrode, the lower electrode including an extended portion;
    forming a capacitor protecting film having a known film thickness to cover the ferroelectric capacitor;
    forming an insulating film on the capacitor protecting film;
    optically measuring a total film thickness of the insulating film and the capacitor protecting film on the extended portion of the lower electrode of the ferroelectric capacitor;
    determining a polishing amount based on the measured total film thickness and the known film thickness of the capacitor protecting film; and
    polishing the insulating layer based on the polishing amount to flatten the insulating layer.

4. The method of manufacturing a semiconductor device as claimed in claim 3, further comprising the steps of:
    optically measuring a total film thickness of the polished insulating film and the capacitor protecting film on the extended portion of the lower electrode of the ferroelectric capacitor; and
    further polishing the insulating film if the measured total film thickness of the polished insulating film and the capacitor protecting film has not reached a predetermined thickness.

5. The method of manufacturing a semiconductor device as claimed in claim 3, further comprising setting a target thickness of the insulating film, wherein the target thickness is a sum of a design thickness of the insulating film and a design thickness of the capacitor protecting film.

6. The method of manufacturing a semiconductor device as claimed in claim 3, wherein the total film thickness of the insulating film and the capacitor protecting film is optically measured inline utilizing a reflection light reflected by the lower electrode of the ferroelectric capacitor.

7. The method of manufacturing a semiconductor device as claimed in claim 3, wherein the lower electrode of the ferroelectric capacitor is made of any one of Ti, TiN, Al, Pt, and Ir.

* * * * *